US010261688B2

(12) United States Patent
Trika et al.

(10) Patent No.: US 10,261,688 B2
(45) Date of Patent: Apr. 16, 2019

(54) PERFORMING SEARCH AND REPLACE OPERATIONS IN A MEMORY DEVICE USING COMMAND PARAMETERS AND A STORAGE CONTROLLER WITHOUT TRANSFERRING DATA TO A PROCESSOR

(71) Applicant: Intel Corporation, Santa Clara, CA (US)

(72) Inventors: Sanjeev Trika, Portland, OR (US); Kshitij Doshi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 15/089,503

(22) Filed: Apr. 2, 2016

(65) Prior Publication Data
US 2017/0285949 A1    Oct. 5, 2017

(51) Int. Cl.
*G06F 3/06* (2006.01)
*G06F 12/06* (2006.01)
(Continued)

(52) U.S. Cl.
CPC .......... *G06F 3/0604* (2013.01); *G06F 3/0659* (2013.01); *G06F 3/0673* (2013.01);
(Continued)

(58) Field of Classification Search
CPC .... G06F 3/0604; G06F 3/0659; G06F 3/0673; G06F 12/06; G06F 12/02; G06F 12/10; G06F 12/126; G06F 17/30; G11C 15/00
See application file for complete search history.

(56) References Cited

U.S. PATENT DOCUMENTS 4,907,173 A * 3/1990 Yamada ................ G06F 3/0489
 400/63
5,465,374 A * 11/1995 Dinkjian ................ G06F 7/026
 708/212
(Continued)

FOREIGN PATENT DOCUMENTS

EP 1126367 A1 8/2001

OTHER PUBLICATIONS

International search report for PCT application No. PCT/US17/20990 filed Mar. 6, 2017; dated May 31, 2017; 14 pages.

*Primary Examiner* — Glenn Gossage
(74) *Attorney, Agent, or Firm* — Thorpe North & Western, LLP

(57) ABSTRACT

An apparatus and method for performing search and replace operations at a storage controller of a storage device are disclosed. The storage controller can receive a search command with one or more parameters that instructs the storage controller to search for a data pattern in data stored in a memory of the apparatus. The storage controller can locally search the data in the memory for the data pattern according to the parameters without transferring the data to a processor to perform the search. The parameters can include, but are not limited to, the data pattern or template to be searched, a data pattern length, a bit-mask, a logical block address (LBA) range, a byte offset, and an alignment parameter. Verdict bits can be provided to indicate data chunks in the memory that match the data pattern. Flags may define potential outputs to provide after searching, such as location and number of matches. A replace command with a set of parameters, including a write mask, can instruct the storage controller to replace the data pattern with a replacement or substitute pattern.

18 Claims, 15 Drawing Sheets

(51) Int. Cl.
*G06F 17/30* (2006.01)
*G06F 12/02* (2006.01)
*G06F 12/10* (2016.01)
*G06F 12/126* (2016.01)
*G11C 15/00* (2006.01)

(52) U.S. Cl.
CPC .............. *G06F 12/02* (2013.01); *G06F 12/06* (2013.01); *G06F 12/10* (2013.01); *G06F 12/126* (2013.01); *G06F 17/30* (2013.01); *G11C 15/00* (2013.01)

(56) References Cited

U.S. PATENT DOCUMENTS

| | | | |
|---|---|---|---|
| 2002/0129053 A1* | 9/2002 | Chan | G06F 17/246 715/213 |
| 2004/0015749 A1 | 1/2004 | Ziegler et al. | |
| 2007/0055831 A1* | 3/2007 | Beeston | G06F 3/0611 711/154 |
| 2009/0150646 A1 | 6/2009 | Allen et al. | |
| 2011/0258497 A1 | 10/2011 | Weissberg et al. | |
| 2012/0182639 A1* | 7/2012 | Hostetter | G06F 3/061 360/15 |
| 2015/0032937 A1* | 1/2015 | Salessi | G06F 13/122 711/103 |

\* cited by examiner

Options to Perform in Response to Replace Command:

Delete non-matching chunks

Delete non-matching LBA ranges

Substitute non-matching chunks with NULL pattern

Substitute non-matching LBA ranges with NULL pattern

Perform next replacement, return offset

FIG. 11

PERFORMING SEARCH AND REPLACE OPERATIONS IN A MEMORY DEVICE USING COMMAND PARAMETERS AND A STORAGE CONTROLLER WITHOUT TRANSFERRING DATA TO A PROCESSOR

BACKGROUND

Memory devices are typically provided as internal, semiconductor, integrated circuits in computers or other electronic devices. There are many different types of memory including volatile memory, for example, dynamic random access memory (DRAM), synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase-change random access memory (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules, among others. The uses for such memory continue to expand.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein:

FIG. 11 illustrates a list of options to perform in response to a replace command in accordance with an example embodiment;

Figure 1:
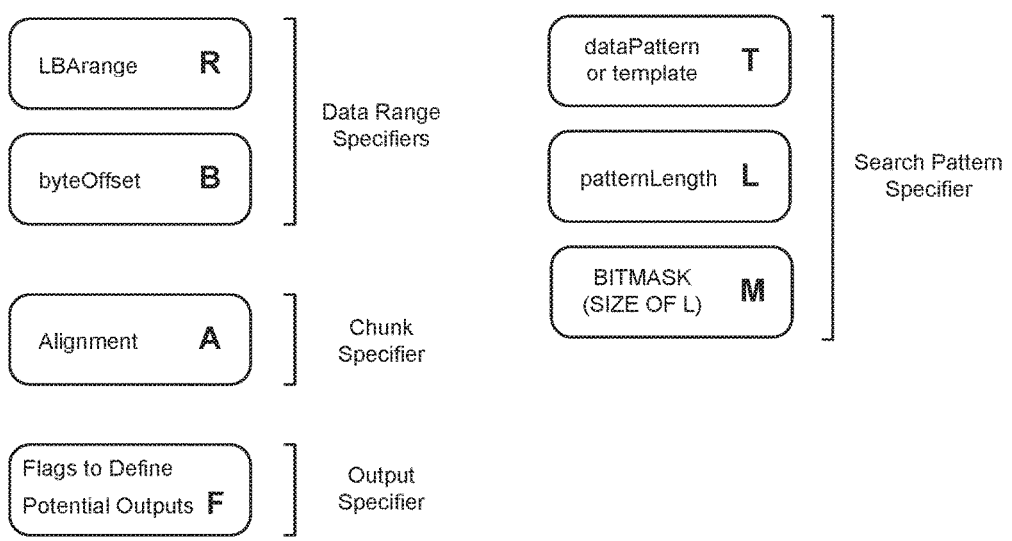
FIG. 1 illustrates a set of parameters used for performing a search command in a storage device in accordance with an example embodiment.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various technology embodiments. One skilled in the relevant art will recognize, however, that such detailed embodiments do not limit the overall inventive concepts articulated herein, but are merely representative thereof.

As used in this specification and the appended claims, the singular forms "a," "an" and "the" include plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one disclosed embodiment. Thus, appearances of the phrases "an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of disclosed embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," "improved," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of memory which is more likely to have write errors to it than other regions in the same memory. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

EXAMPLE EMBODIMENTS

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

Search and replace operations are commonly used in a number of computer applications, such as word processing applications. As a non-limiting example, the term "duck" can be searched for in a text document and replaced with the term "beaver". Search and replace functions can also be used for databases and on servers for web searches. However, search and replace operations can consume a relatively high amount of bandwidth and/or processing power. In other words, search and replace operations can use bandwidth and/or be central processing unit (CPU) intensive. For example, in search/select operations performed in a database, a relatively large amount of data can be read by a processor from a storage device and compared against a value or a range of values, with matching entries being retained while the remaining entries are discarded. Similarly, for replace operations, a relatively large amount of data can be read by the processor from the storage device, with a relatively small number of entries being replaced and the remaining entries discarded.

In embodiments of the present technology, search and replace operations can be performed on a storage device. In one example, the search and replace operations can be performed at a storage controller of the storage device. In another example, the search and replace functionalities can be performed at a non-volatile memory (NVM) memory controller or a volatile memory controller. The storage device may not transfer data to a processor (e.g. a central processor or host processor) in order to perform the search and replace operations. As a result, data transfers from the storage device to the processor can be reduced. In addition, processor consumption can be reduced since data may not be transferred from the storage device to the processor to perform the search and replace functionalities.

Storage devices can include volatile memory, non-volatile memory, or a combination thereof. Exemplary storage devices can include any combination of DRAM, SDRAM, hard disk drive (HDD), a solid-state drive (SSD), a redundant array of independent disks (RAID) volume, a non-volatile dual in-line memory module (NVDIMM), a network attached storage, phase change memory (PCM), flash memory, which can include NAND memory and NOR memory, a three dimensional cross point (3D XPoint) memory, write in place non-volatile magnetic RAM (MRAM) (NVMRAM), and so forth.

In one configuration, the storage device can implement two new commands—a search command and a replace command. The storage device can perform the search internally without transferring data to a host processor, and depending on usage, the storage device can provide location(s) of matches, a number of matches and/or replacement operations. Therefore, since the search and replace operations can be performed internally in the storage device, the search and replace operations can be performed without a general purpose computation intensive logic (e.g., a host processor) on the side of the storage device.

By performing the search and replace operations internally in the storage device without transferring data to the host processor, the number of bytes moved through input output (I/O) links, memory and cache buffers can be reduced (e.g., by several orders of magnitude). Rather than transferring a relatively large amount of data to the host processor in order to extract or replace a relatively small amount of data in memory, the search and replace operations can be performed internally in the storage device or using logic separate from the host processor. This also reduces the amount of processing overhead at the host computer, as well as the number of interrupts and kernel transitions at the host computer, which achieves additional performance, power and data scaling benefits. The storage device can further optimize operations internally in view of the I/O that would otherwise be requested from the host processor to perform the search and replace operations. In addition, by performing the search and replace operations internally, the search and replace operations can be parallelized across multiple storage devices.

FIG. 1 illustrates an exemplary set of parameters used for performing a search command in a storage device. The set of parameters can be included in a search command transmitted to the storage device from a host processor. The parameters can include data range specifiers, search pattern specifiers, a data chunk specifier, and an output specifier. The parameters can cause the search function to be performed in data stored in memory of the storage device.

The search pattern specifiers can include a data pattern (T), a data pattern length (L) and a bitmask (M). The data pattern (or search pattern or search template) can indicate a string of numerals and/or characters to be searched for in data stored in memory of the storage device. The data pattern length can indicate a length of the data pattern. The bit mask can indicate a portion of the data pattern to be ignored when searching the data stored in the memory. In other words, the bit mask can qualify which portions of the data pattern are either to match or not to match (down to a bit level). A size of the bit mask can correspond to the data pattern length (L). In other words, M is a bitmask of a length size of (L).

The data range specifiers can include a logical block addressing (LBA) range (R) and a byte offset (B). The LBA range can indicate a range within the memory in which to search for the data pattern. In addition, the byte offset can be utilized when searching for the data pattern. Thus, the LBA range can define a range of blocks in the memory, and the data pattern can be searched across the range of blocks to discover matches.

The data chunk specifier can include an alignment (A). The alignment can define a distance to shift when searching for the data pattern in the data stored in the memory. In one example, the alignment can be represented in bytes.

The output specifier can include flags (F). The flags can define potential outputs to provide after searching for the data pattern. The potential outputs can include location(s) of matches of the data pattern in the data stored in the memory and a number of matches of the data pattern. Therefore, an output of the search operation can be defined, via the flags, such that matches can be extracted, counted or iterated over the range of blocks. The flags defining the potential outputs can be defined by a user associated with the memory device.

Figure 2:
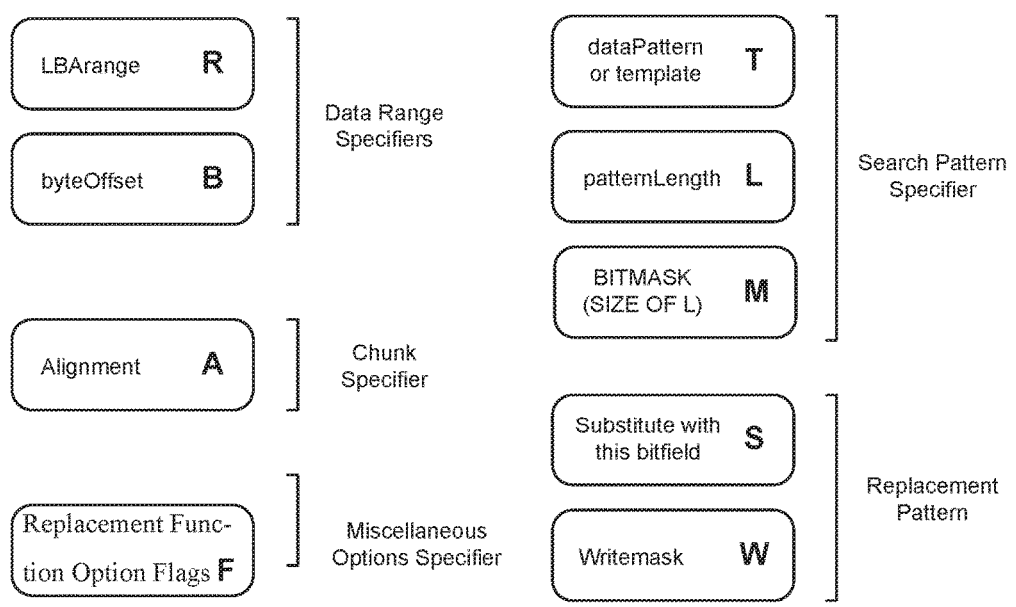
FIG. 2 illustrates a set of parameters used for performing search and replace commands in a storage device in accordance with an example embodiment.

FIG. 2 illustrates an exemplary set of parameters used for performing search and replace commands in a storage device. The set of parameters can be included in a search and replace command transmitted to the storage device from a host processor. The parameters can include data range specifiers, search pattern specifiers, a data chunk specifier, replacement pattern specifiers, and an option specifier. The parameters can enable the search and replace functions to be performed in data stored in memory of the storage device.

The search pattern specifiers can include a data pattern (T), a data pattern length (L) and a bitmask (M). The data range specifiers can include a logical block addressing (LBA) range (R) and a byte offset (B). The data chunk specifier can include an alignment (A). The replacement pattern specifiers can include a substitute or substitution pattern (S), which is also referred to as a replacement pattern, and the replacement pattern specifiers can also include a write mask (W). The substitution pattern is to replace portions of data in the memory that match the search pattern. The write mask can enable the substitution pattern to be merged or blended with the search pattern, rather than a complete replacement of the search pattern with the substitution pattern. The miscellaneous options specifier can include flags (F), which define potential options to provide for the replacement function. For example, the flags can allow for iteration over matching ranges for increased flexibility. The flags defining the potential options can be defined by a user associated with the memory device.

In one configuration, a search command can be provided to the storage device or other logic (e.g., from a host processor). The search command can be pseudo coded as follows: Search (LBArange, byteOffset, dataPattern, patternLength, bitmask, alignment, flags). After receiving the search command, the storage device can internally read data from memory at the specified LBArange. The storage device can view the data as a data stream. The data stream, starting at a specified offset, can be searched for the specified dataPattern. The dataPattern can be searched for with the bitmask. The dataPattern can be of length patternLength (in bytes). The search can be repeated (e.g., hardware accelerated) after each of the alignment bytes in the data stream. In one example, based on the flag parameter, the storage device can save all matches internally as [LBA, offset] tuples, and return the [LBA, offset] tuples as a response to the search command. In another example, based on the flag parameter, the storage device can stop at the first match and provide a response to the search command. The storage device can continue searching from a previous location associated with the first match if instructed by the host processor.

In one configuration, a search and replace command can be provided to the storage device or other device (e.g., from a host processor). The search and replace command can be pseudo coded as follows: Replace (LBArange, byteOffset, dataPattern, patternLength, bitmask, alignment, newData, blendMask, flags). After receiving the search command, the storage device can internally read data from memory at the specified LBArange. The storage device can view the data as a data stream. The data stream, starting at a specified offset, can be searched for the specified dataPattern. The dataPattern can be searched for with the bitmask. The dataPattern can be of length patternLength (in bytes). The search can be repeated (e.g., hardware accelerated) after each of the alignment bytes in the data stream. After finding a match, data currently stored at a match location in the memory of the storage device can be updated with the specified newData. In other words, the dataPattern can be replaced by the newData. If a blendMask is provided in the search and replace command, then the newData can be blended into the dataPattern, as specified by the blendMask. Based on the flags parameter, the storage device can perform a bulk replace function whenever a match occurs, perform one match at a time, replace or not replace non-matching elements with a NULL pattern, etc.

In one example, search processing can be accelerated by reading multiple memory regions (e.g., NVM dies) in parallel in the storage device. In addition, the search processing can be accelerated by parallelizing the search in hardware via multiple comparators. Replace processing can be accelerated in a similar manner. In addition, multiple writes to a block of memory (e.g., a block of NVM) in the storage device can be combined when there are multiple matches to different sections in the block of memory.

Figure 3:
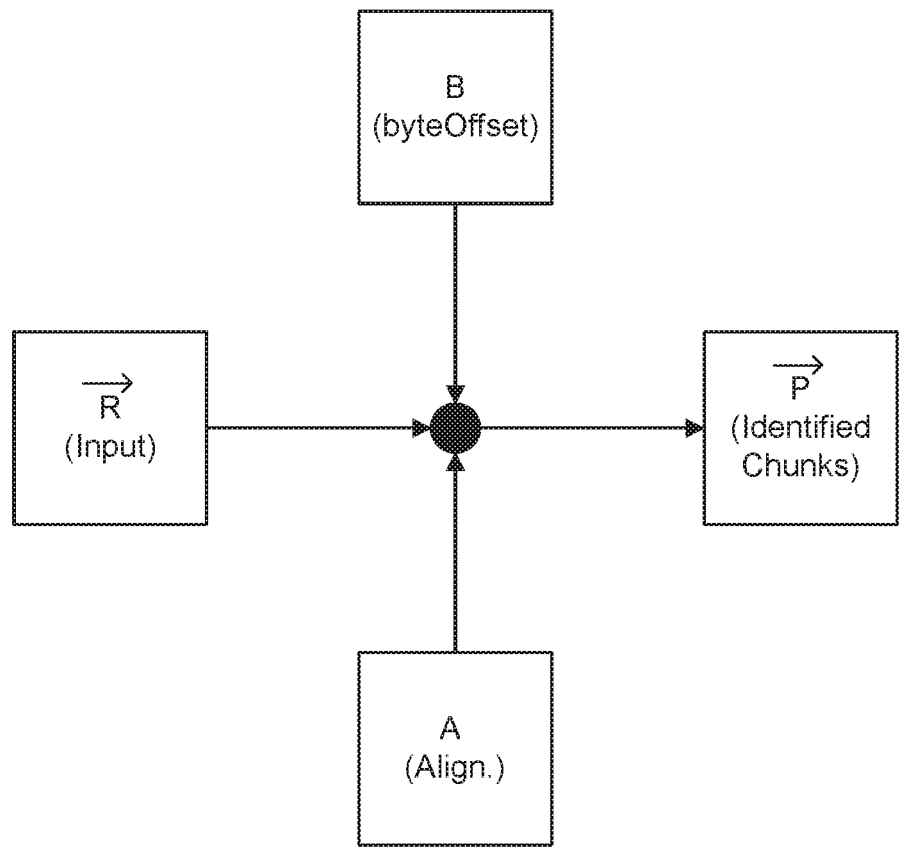
FIGS. 3-5 illustrate an identification of data chunks in a memory based on one or more parameters in a search and/or replace command in accordance with an example embodiment.

FIG. 3 illustrates an exemplary identification of data chunks in a memory based on one or more parameters in a search and/or replace command. A storage device can receive the search and/or replace command that includes the one or more parameters. More specifically, hardware in or communicatively coupled to the storage device (e.g., a storage controller) can receive the search and/or replace command. The parameters can include a logical block addressing (LBA) range (R), a starting byte offset (B), and an alignment (A). Given an input vector R, which corresponds to the LBA range, and the starting byte offset (B) and the alignment (A), the storage device can identify data chunks in memory of the storage device. The data chunks in the memory can be distinguished from data blocks in the memory, where the data chunks are identified from the LBA range (R), byte offset (B) and alignment (A) can be represented by a vector P.

Figure 4:
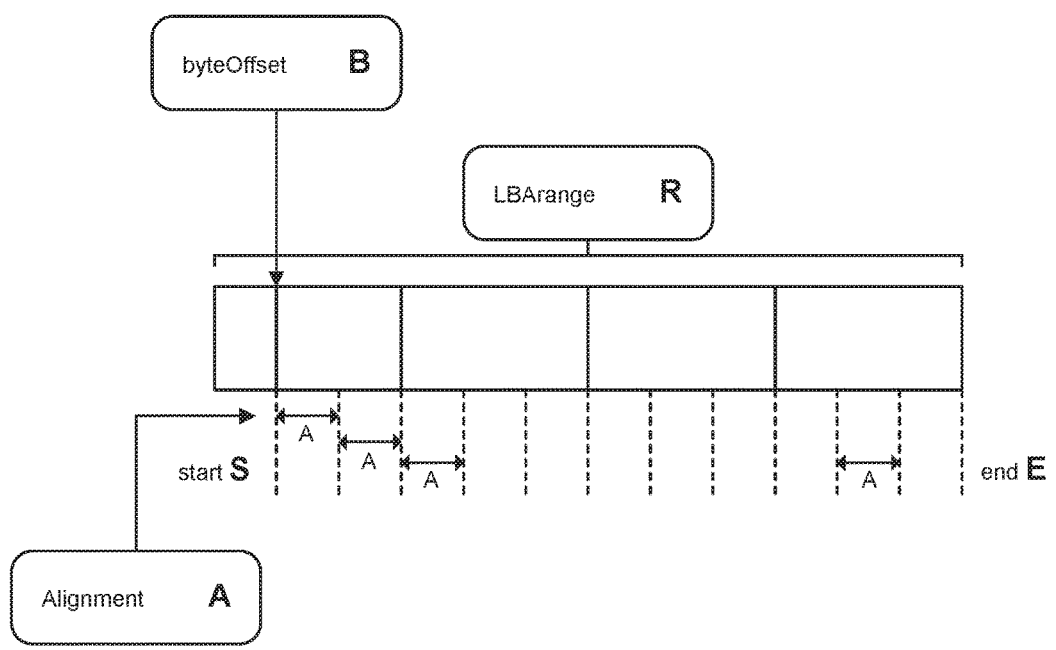

FIG. 4 illustrates an exemplary identification of data chunks in a memory based on one or more parameters in a search and/or replace command. A storage device or other device can receive the search and/or replace command that includes the one or more parameters. The parameters can include a logical block addressing (LBA) range (R), a starting byte offset (B), and an alignment (A). The LBA range (R), the byte offset (B) and the alignment (A) can be used to identify data chunks in memory of the storage device. As shown in FIG. 4, a data chunk can start at a first data block in the LBA range (R) and in accordance with the byte offset (B). From the start of a given data chunk, at a distance given by the alignment (A), is the start of a subsequent data chunk. In one example, the LBA range (R) can be flexible such that a data chunk does not have to end at the LBA range (R). For example, the LBA range (R) can include a starting LBA and a number of data chunks to compare based on a search and/or replace command.

Figure 5:
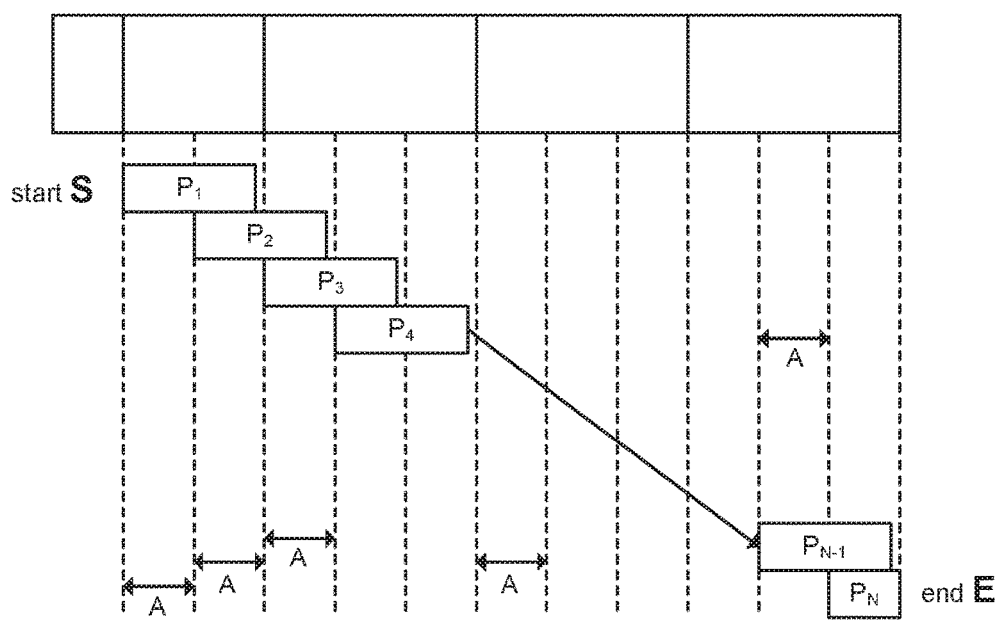

FIG. 5 illustrates an exemplary identification of data chunks in a memory based on one or more parameters in a search and/or replace command. A storage device can receive the search and/or replace command that includes the one or more parameters. The parameters can include a logical block addressing (LBA) range (R), a starting byte offset (B), and an alignment (A). The LBA range (R), the byte offset (B) and the alignment (A) can be used to identify data chunks in memory of the storage device. As shown in FIG. 5, with respect to the search operation, an input LBA range (R) can include N data chunks, wherein N is an integer. A first data chunk can start at a starting position (S). (The starting position "S" shown in FIGS. 4 and 5 should not be confused with the substitution pattern "S" shown in FIGS. 2 and 10.) A second data chunk can start at S+A, a third data chunk can start at S+2A, a fourth data chunk can start at S+3A, and so on. The data chunks can end at an ending position (E). A given data chunk may not be sized equal to A, but rather can be sized by a data pattern length (L). As shown in FIG. 5, the LBA range (R) can start with a first data chunk ($P_1$) at the starting position (S), and the LBA range (R) can end with an Nth data chunk ($P_N$) at the ending position (E).

Figure 6:
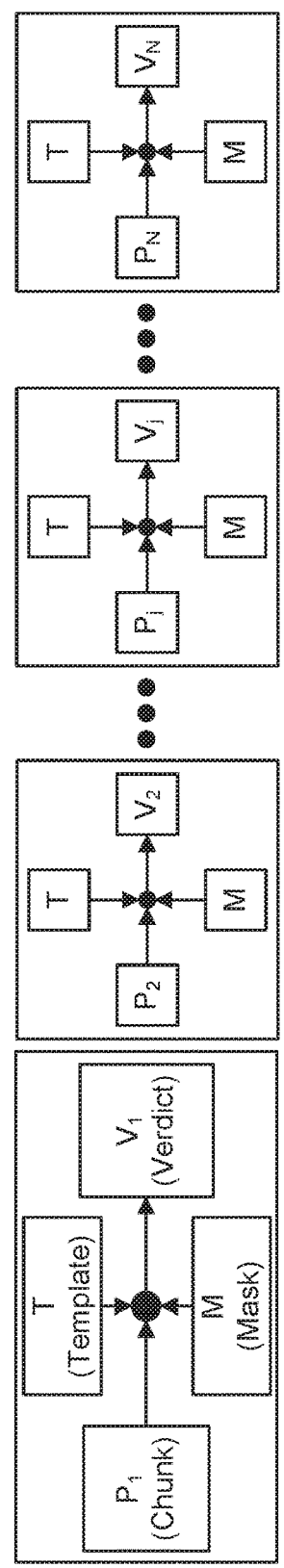
FIG. 6 illustrates a comparison between a data pattern and a plurality of data chunks to generate a verdict for each of the plurality of data chunks in accordance with an example embodiment.

FIG. 6 illustrates an exemplary comparison between a data pattern and a plurality of data chunks to generate a verdict for each of the plurality of data chunks. As previously explained, a storage device can receive a search and/or replace command, and the storage device can identify a plurality of data chunks in memory of the storage device. The storage device can identify the data chunks based on one or more parameters included in the search and/or replace command (e.g., an LBA range, byte offset, alignment). Next, the storage device can compare each of the data chunks to a data pattern (T) to identify data chunks that match the data pattern. In other words, the storage device can determine whether a given data chunk includes the data pattern that is being searched. The data chunks that match the data pattern can be identified modulo a bit mask (M), wherein the bit mask is included in the one or more parameters included in the search and/or replace command. For each data chunk, the storage device can generate a verdict indicating whether or not the data chunk matches the data pattern. The verdict for each data chunk can be a single bit indication verdict (V).

As shown in the example in FIG. 6, for a first data chunk ($P_1$), a data pattern (T) and a bit mask (M), the storage device can generate a first verdict ($V_1$). Similarly, for an Nth data chunk ($P_N$), the data pattern (T) and the bitmask (M), the storage device can generate an Nth verdict ($V_N$).

Figure 7:
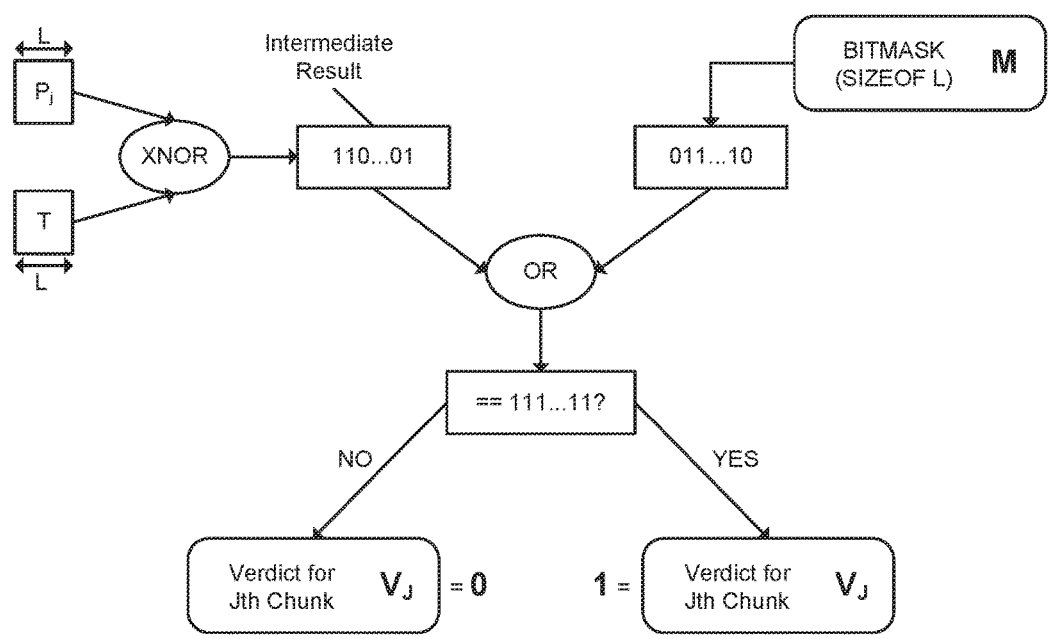
FIG. 7 illustrates a generation of a verdict for a single data chunk in accordance with an example embodiment.

FIG. 7 illustrates an exemplary generation of a verdict for a single data chunk. The verdict can be determined based on a comparison of the single data chunk to a data pattern and in view of a bitmask. In one example, a verdict of "1" can indicate that a given data chunk matches the data pattern modulo the bit mask, and a verdict of "0" can indicate that a given data chunk does not much the data pattern.

As shown in the example in FIG. 7, a storage device can determine whether a Jth data chunk P[J] matches a data pattern (T), and a verdict can be generated indicating whether or not the Jth data chunk P[J] matches the data pattern (T). More specifically, an XNOR operation can be performed on the Jth data chunk P[J] and the data pattern (T), wherein the Jth data chunk P[J] is a length (L) and the data pattern (T) is also the length (L). The XNOR operation can be performed on the Jth data chunk P[J] and the data pattern (T) at a bit for bit level, which results in a first series of "0"s and/or "1" s. In addition, a bitmask (M) can be utilized to identify certain comparisons, and thus mismatches, between the Jth data chunk P[J] and the data pattern (T) that can be ignored. The bitmask (M) can indicate a second series of "0"s and/or "1" s. An OR operation can be performed on the first series (based on the comparison of the Jth data chunk and the data pattern) and the second series (from the bitmask) to produce a third series of "0"s and/or "1" s. If the third series is all "1" s, then the verdict of the Jth data chunk P[J] is equal to "1". In other words, a verdict of "1" indicates that the Jth data chunk P[J] matches the data pattern (T) modulo the bitmask (M). If the third series is not all "1" s, then the verdict of the Jth data chunk P[J] is equal to "0". In other words, a verdict of "0" indicates that the Jth data chunk P[J] does not match the data pattern (T).

Figure 8:
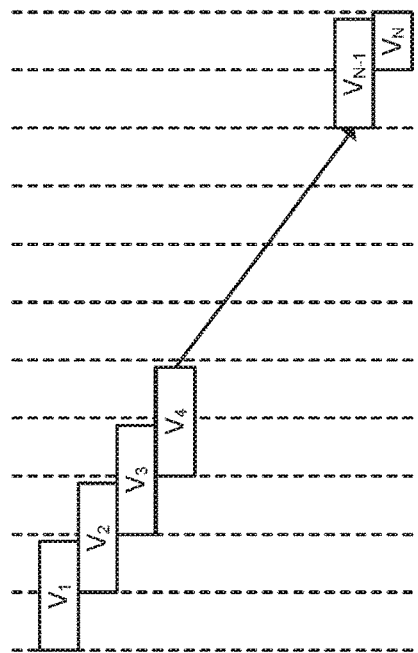
FIG. 8 illustrates a vector of verdict bits corresponding to a plurality of data chunks in accordance with an example embodiment.
Figure 8:
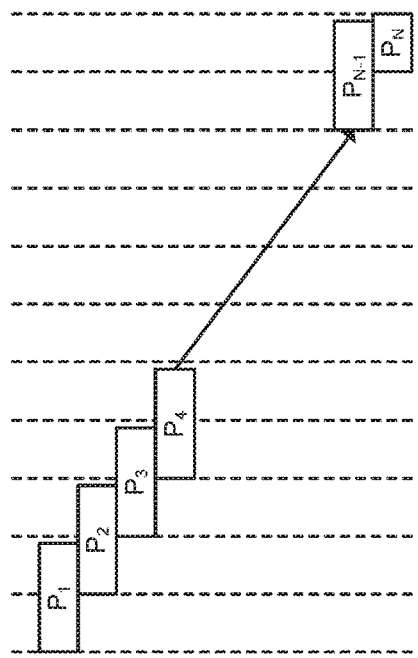

FIG. 8 illustrates an exemplary vector of verdict bits corresponding to a plurality of data chunks. A storage device can generate the vector of verdict bits, wherein each verdict bit corresponds to a particular data chunk. As previously described, a verdict bit of "1" for a given data chunk can indicate a match (modulo the bitmask) between the data chunk and a data pattern, and a verdict bit of "0" for the given data chunk can indicate that there is not a match between the data chunk and the data pattern.

As shown in the example in FIG. 8, for a first data chunk ($P_1$), the storage device can determine a first verdict bit ($V_1$). For a second data chunk ($P_2$), the storage device can determine a second verdict bit ($V_2$). Similarly, for an Nth data chunk ($P_N$), the storage device can determine an Nth verdict bit ($V_N$).

Figure 9:
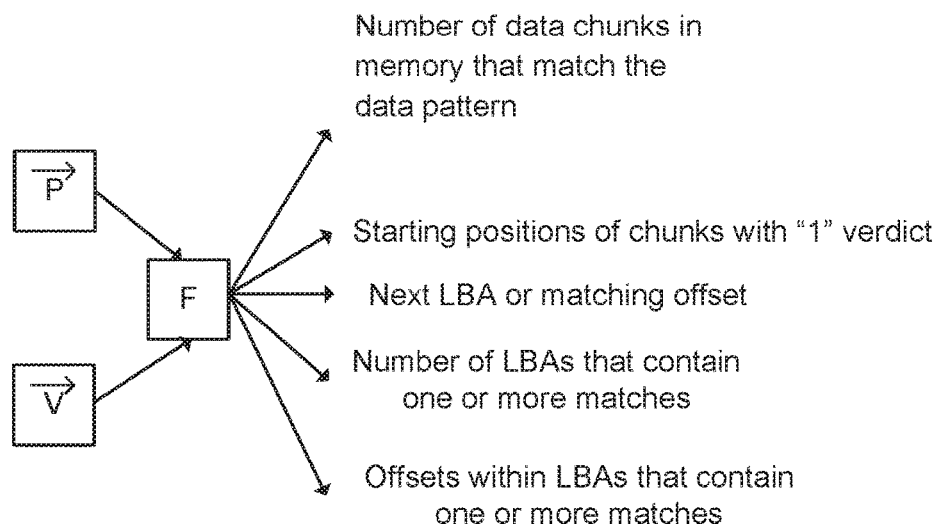
FIG. 9 illustrates a list of options for delivering search command results in accordance with an example embodiment.

FIG. 9 illustrates an exemplary list of options for delivering search command results. The search command results can be provided in view of a vector of verdict bits (V) and a plurality of data chunks (P), which results in a flag (F) that represents an input into a search and replace engine. In one example, the type of search command results that are provided can be selected by a user associated with the storage device. While not intended to be limiting, the storage device can provide the following: (1) a stream of matching data chunks as the matching data chunks are being detected; (2) a number (or count) of data chunks in the memory that match the data pattern; (3) a starting position (or address) for each of the data chunks in the memory that match the data pattern; (4) a position of a next data chunk in the memory that matches the data pattern; (5) a next logical block addressing (LBA) range or offset in the memory that contains data chunk(s) that match the data pattern; (6) a number of LBA ranges in the memory containing data chunk(s) that match the data pattern; or (7) offsets within LBA ranges that contain data chunk(s) that match the data pattern. In addition, the storage device can stream an indication of the LBA ranges that contain data chunk(s) that match the data pattern and/or an indication of the matching data chunks in an immediate or cursorized manner, such that the user associated with the storage device can obtain matching elements (e.g., data chunks or LBA ranges) one at a time and in or out of stream sequence.

Figure 10:
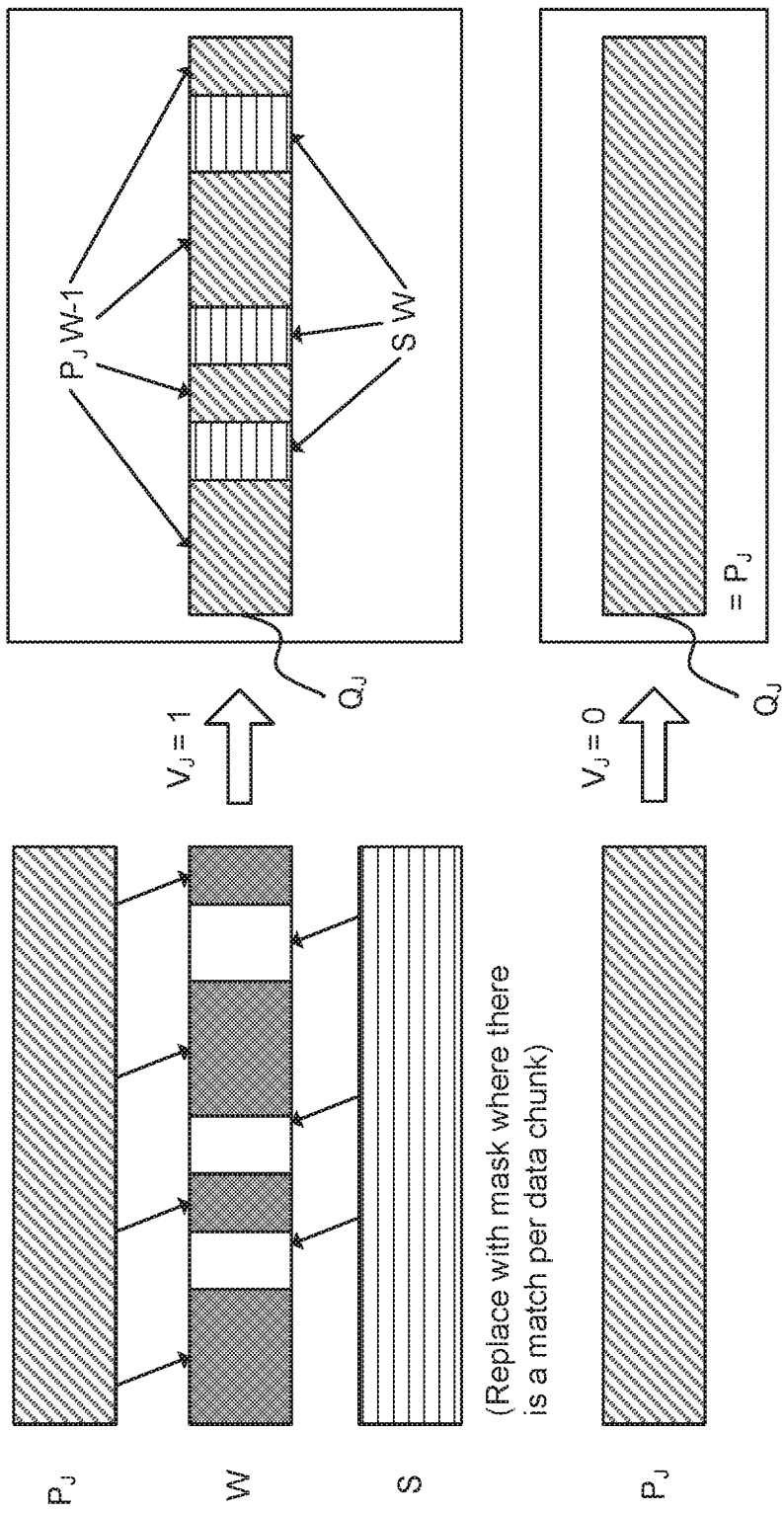
FIG. 10 illustrates a technique for replacing a data pattern with a replacement pattern based on a set of parameters in accordance with an example embodiment.

FIG. 10 illustrates an exemplary technique for replacing a data pattern with a substitution pattern (or replacement pattern) based on a set of parameters. As previously explained, a storage device can identify data chunks in memory of the storage device, compare each of the data chunks to a data pattern to identify data chunks that match the data pattern, generate a vector of verdict bits corresponding to the plurality of data chunks, and provide an output based on the vector of verdict bits. At this point, the storage device can perform the operation of replacing the data pattern (that matches a data chunk in the memory) with the substitution pattern.

As shown in FIG. 10, for a given data chunk P[J], if a verdict (Vs) associated with the data chunk P[J] is equal to "0", then a data pattern is not replaced with a substitution pattern. In other words, since the verdict (Vs) of the data chunk P[J] equaling "0" indicates that there is not a match between the data chunk P[J] and the data pattern, the data pattern is not replaced with the substitution pattern. In contrast, for the given data chunk P[J], if the verdict (Vs) associated with the data chunk P[J] is equal to "1", then the data pattern is replaced with the substitution pattern. In other words, since the verdict (Vs) of the data chunk P[J] equaling "1" indicates that there is a match between the data chunk P[J] and the data pattern, the data pattern can be replaced with the substitution pattern.

In one example, when there is a match between the data chunk P[J] and the data pattern (i.e., when the verdict (Vs) is equal to "1"), the substitution pattern (S) can be applied. More specifically, bits from a write mask (W) can specify how the substitution pattern (S) is blended into the data chunk P[J]. In other words, the write mask (W) can enable the substitution pattern (S) to be merged or blended with the data chunk P[J] (or the data pattern that is searched for), rather than a complete replacement of the data chunk P[J] with the substitution pattern (S).

As shown in FIG. 10, when $V_J$ is equal to "1", the data chunk P[J] can be merged or blended with the substitution pattern (S) in accordance with the write mask (W) to produce a result ($Q_J$). The result ($Q_J$) incorporates the data chunk P[J] merged or blended with the substitution pattern (S) in corresponding locations of the write mask (W).

In one example, the replacement function can be performed in a serial manner, such that when a match occurs from neighboring but overlapping data chunks, a blind replacement function is not performed.

FIG. 11 illustrates an exemplary list of options to perform in response to a replace command. A storage device can perform one or more of the options based on user settings. In other words, a user associated with the storage device can select which of the options are to be performed in response to the replace command. The option can be performed in view of a data chunk (P), a substitution pattern (S) and a write mask (W), which results in a flag (F) that represents the option to perform at the storage device. While not intended to be limiting, the storage device can provide the following outputs: (1) delete data chunks in memory that do not match the data pattern; (2) eliminate one or more logical block addressing (LBA) ranges from the memory when the LBA ranges do not contain data chunks that match the data pattern; (3) substitute data chunks in the memory that do not match the data pattern with a null pattern; (4) substitute one or more LBA ranges with a null pattern when the LBA ranges do not contain data chunks that match the data pattern; or (5) perform a next replacement and return an offset.

In one example, the blending of the substitution pattern (S) can be performed on a data chunk by data chunk basis. Therefore, a replacement for a first data chunk (K) can be performed prior to a second data chunk (K+1), and a replacement for the second data chunk (K+1) can be performed prior to a third data chunk (K+2), and so on. The storage device can handle items (e.g., data chunks or LBA ranges) that do not contain matches in various manners. In one example, the storage device can delete or eliminate non-matching items (e.g., data chunks, LBA ranges) altogether. In another example, the storage device can substitute non-matching elements with an original pattern (i.e., no substitution is performed) or replace the non-matching elements with a null value (based on application), which does not change the sizes of objects stored on the memory of the storage device.

Figure 12:
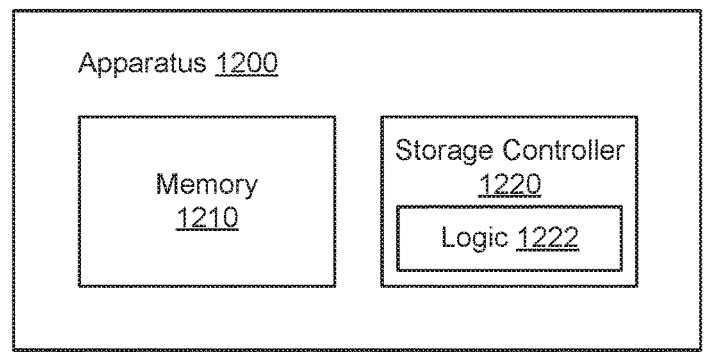
FIG. 12 illustrates an apparatus that comprises a memory and a storage controller in accordance with an example embodiment.

FIG. 12 illustrates an exemplary apparatus 1200. The apparatus 1200 can include a memory 1210 and a storage controller 1220. The storage controller 1220 includes logic 1222 that can be configured to receive a search command with one or more parameters that instructs the storage controller 1220 to search for a data pattern in data stored in the memory 1210. The storage controller 1220 can be configured to search the data stored in the memory 1210 for the data pattern according to the one or more parameters included in the search command. The storage controller 1220 can be configured to locally search the data in the memory 1210 for the data pattern without transferring the data to a processor to perform the search.

Figure 13:
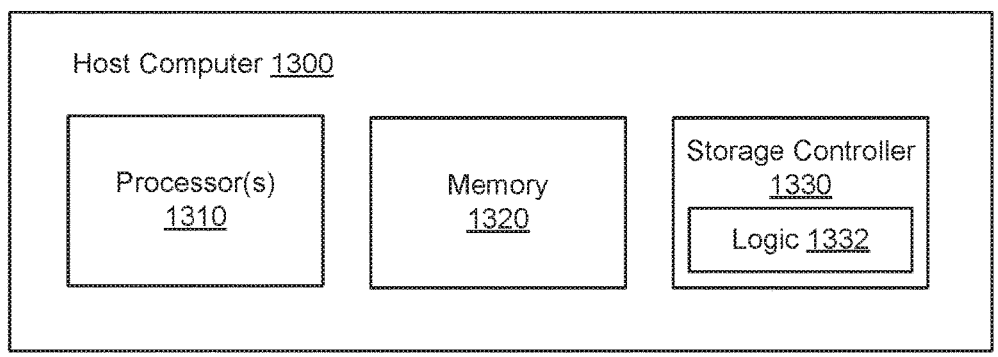
FIG. 13 illustrates a host computer that comprises one or more processors, a memory and a storage controller in accordance with an example embodiment.

FIG. 13 illustrates an exemplary host computer 1300. The host computer 1300 can include one or more processors 1310, a memory 1320 and a storage controller 1330. The storage controller 1330 includes logic 1332 that can be configured to receive, from the processor 1310, a search command with a first set of parameters that instructs the storage controller 1330 to search for a data pattern in data stored in the memory 1320. The storage controller 1330 can be configured to search the data stored in the memory 1320 for the data pattern based on the first set of parameters included in the search command. At least one instance of the data pattern can be detected in the data stored in the memory 1320. The storage controller 1330 can be configured to receive, from the processor 1310, a replace command with a second set of parameters that instructs the storage controller 1330 to replace the at least one instance of the data pattern with a replacement pattern. The storage controller 1330 can be configured to replace the at least one instance of the data pattern with the replacement pattern based on the second set of parameters included in the replace command.

Figure 14:
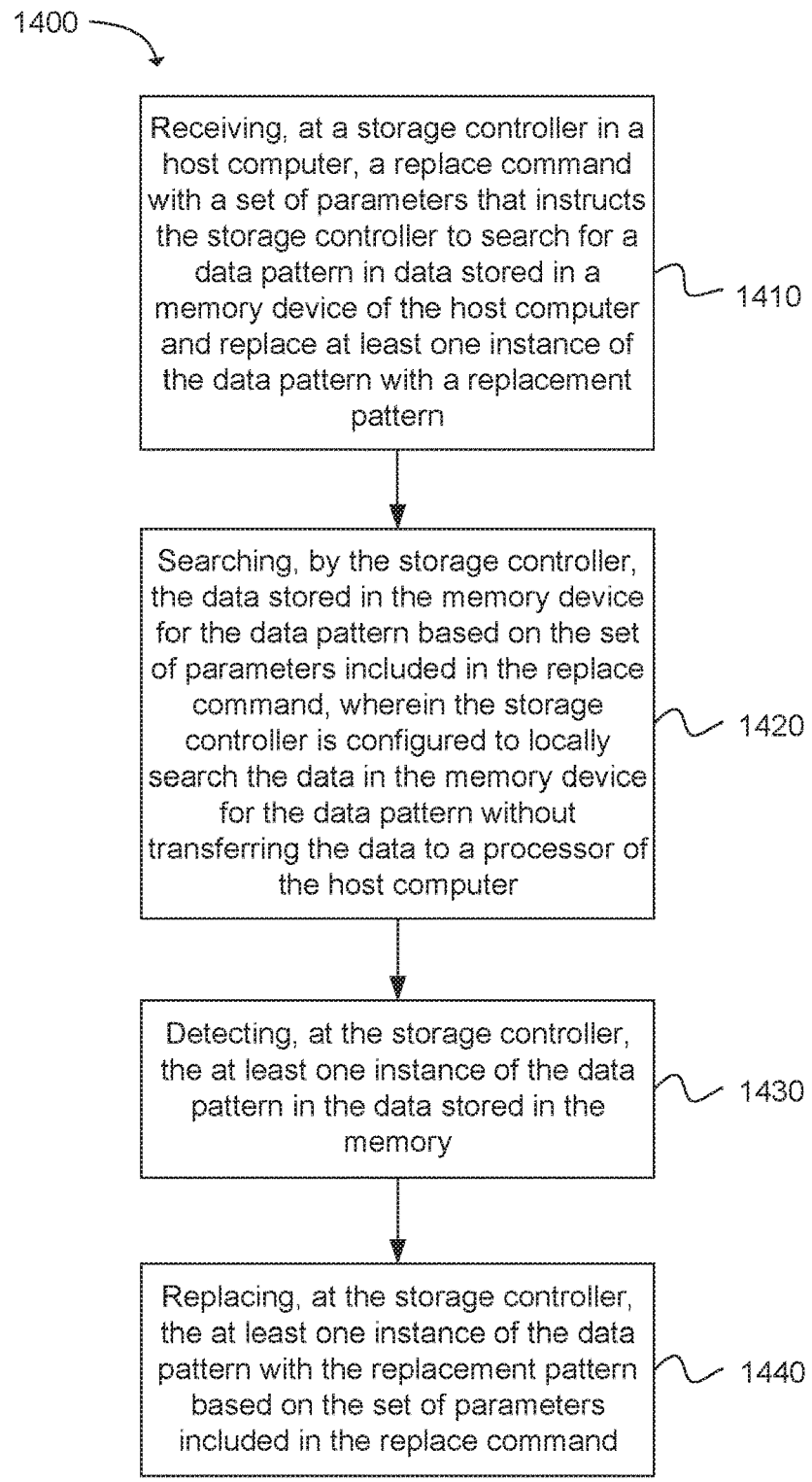
FIG. 14 depicts a flowchart of a method for performing search and replace operations in a memory in accordance with an example embodiment.

Another example provides a method 1400 for performing search and replace operations in a memory, as shown in the flow chart in FIG. 14. The method can be executed as instructions on a machine, where the instructions are included on at least one computer readable medium or one non-transitory machine readable storage medium. The method includes the operation of: receiving, at a storage controller in a host computer, a replace command with a set of parameters that instructs the storage controller to search for a data pattern in data stored in a memory device of the host computer and replace at least one instance of the data pattern with a replacement pattern, as in block 1410. The method further includes the operation of: searching, by the storage controller, the data stored in the memory device for the data pattern based on the set of parameters included in the replace command, wherein the storage controller is configured to locally search the data in the memory device for the data pattern without transferring the data to a processor of the host computer, as in block 1420. The method further includes the operation of: detecting, at the storage controller, at least one instance of the data pattern in the data stored in the memory, as in block 1430. The method further includes the operation of: replacing, at the storage controller, the at least one instance of the data pattern with the replacement pattern based on the set of parameters included in the replace command, as in block 1440.

Figure 15:
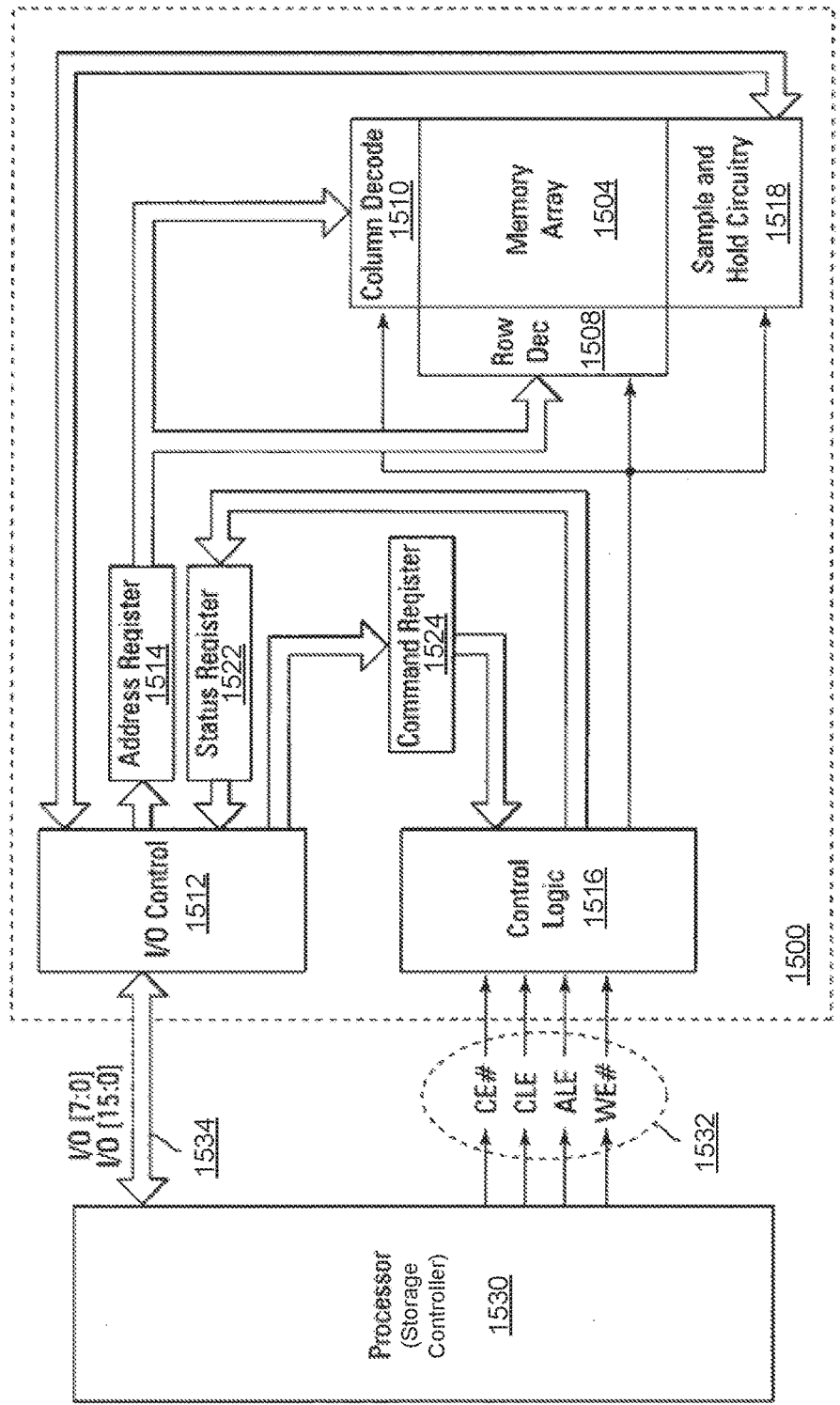
FIG. 15 illustrates a memory system diagram in accordance with an example embodiment.

FIG. 15 is a simplified block diagram of a storage device 1500 according to an embodiment, and on which various methods can be practiced. Storage device 1500 includes a memory with an array 1504 of memory cells arranged in rows and columns. Although the various embodiments will be described primarily with reference to NAND memory arrays, the various embodiments are not limited to a specific architecture or type of memory array 1504. Some examples of specific array architectures include NOR arrays, AND arrays, PCM arrays, and virtual ground arrays. In general, however, the embodiments described herein are adaptable to any array architecture permitting generation of a data signal indicative of state of a memory cell, such as through a threshold voltage of a memory cell.

A row decode circuitry 1508 and a column decode circuitry 1510 are provided to decode address signals provided to the storage device 1500. Address signals are received and decoded to access memory array 1504. Storage device 1500 also includes input/output (I/O) control circuitry 1512 to manage input of commands, addresses and data to the storage device 1500 as well as output of data and status information from the storage device 1500. An address register 1514 is coupled between I/O control circuitry 1512 and row decode circuitry 1508 and column decode circuitry 1510 to latch the address signals prior to decoding. A command register 1524 is coupled between I/O control circuitry 1512 and control logic 1516 to latch incoming commands. Control logic 1516 controls access to the memory array 1504 in response to the commands and generates status information for an external processor 1530 (also known as a storage controller as described earlier). The control logic 1516 is coupled to row decode circuitry 1508 and column decode circuitry 1510 to control the row decode circuitry 1508 and column decode circuitry 1510 in response to the addresses.

Control logic 1516 can be coupled to a sample and hold circuitry 1518. The sample and hold circuitry 1518 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 1518 can further provide for amplification and/or buffering of the sampled signal to provide a stronger data signal to an external device.

The handling of analog data signals can take an approach where charge levels generated are stored on capacitors. A charge can be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 1512 for output from the storage device, in the case of a read operation, or used for comparison during one or more verify operations in programming the storage device. It is noted that the I/O control circuitry 1512 could optionally include analog-to-digital conversion (ADC) functionality and digital-to-analog conversion (DAC) functionality to convert read data from an analog data signal to a digital bit pattern and to convert write data from a digital bit pattern to an analog signal such that the storage device 1500 could be adapted for communication with either an analog or digital data interface.

During a programming operation, target memory cells of the memory array 1504 are programmed until voltages indicative of their Vt (threshold voltage) levels match the levels held in the sample and hold circuitry 1518. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 1518 for transfer to an external processor (not shown in FIG. 15) either directly as analog signals or as digitized representations of the analog signals depending upon whether ADC/DAC functionality is provided external to, or within, the storage device.

Threshold voltages of cells can be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 1518 can include caching, i.e., multiple storage locations for each data value, such that the storage device 1500 can be reading a next data value while passing a first data value to the external processor, or receiving a next data value while writing a first data value to the memory array 1504. A status register 1522 is coupled between I/O control circuitry 1512 and control logic 1516 to latch the status information for output to the external processor.

Storage device 1500 receives control signals at control logic 1516 over a control link 1532. The control signals can include a chip enable CE#, a command latch enable CLE, an address latch enable ALE, and a write enable WE#. Storage device 1500 can receive commands (in the form of command signals), addresses (in the form of address signals), and data (in the form of data signals) from an external processor over a multiplexed input/output (I/O) bus 1534 and output data to the external processor over I/O bus 1534.

In a specific example, commands are received over input/output (I/O) pins [7:0] of I/O bus 1534 at I/O control circuitry 1512 and are written into command register 1524. The addresses are received over input/output (I/O) pins [7:0] of bus 1534 at I/O control circuitry 1512 and are written into address register 1514. The data can be received over input/output (I/O) pins [7:0] for a device capable of receiving eight parallel signals, or input/output (I/O) pins [15:0] for a device capable of receiving sixteen parallel signals, at I/O control circuitry 1512 and are transferred to sample and hold circuitry 1518. It will be appreciated by those skilled in the art that additional circuitry and signals can be provided, and that the storage device of FIG. 15 has been simplified to help focus on the embodiments of the disclosure.

While FIG. 15 has been described with respect to sample and hold circuitry 1518, it should be understood that the control logic 1516 could be coupled to data latches instead of sample and hold circuitry 1518 without departing from the scope of the disclosure. During a write operation, target memory cells of the memory array 1504 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 15 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 1534. Because the data signals represent bit patterns instead of individual bits, serial communication of an 8-bit data signal could be as efficient as parallel communication of eight signals representing individual bits.

Figure 16:
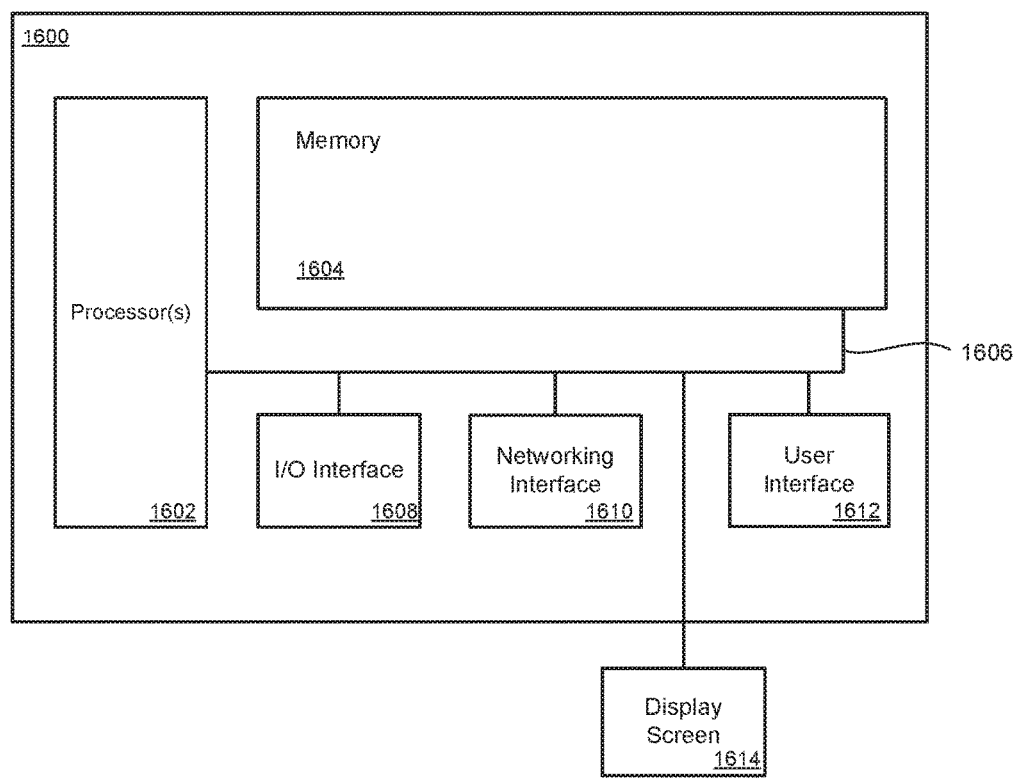
FIG. 16 illustrates a computing system that includes a memory in accordance with an example embodiment.

FIG. 16 illustrates a general computing system 1600 that can be employed in the present technology. The computing system 1600 can include one or more processors 1602 in communication with a memory 1604. The memory 1604 can include any device, combination of devices, circuitry, and the like that is capable of storing, accessing, organizing and/or retrieving data. Non-limiting examples include SANs (Storage Area Networks), cloud storage networks, volatile or non-volatile RAM, phase change memory, optical media, hard-drive type media, and the like, including combinations thereof.

The computing system 1600 additionally includes a local communication interface 1606 for connectivity between the various components of the system. For example, the local communication interface 1606 can be a local data bus and/or any related address or control busses as may be desired.

The computing system 1600 can also include an I/O (input/output) interface 1608 for controlling the I/O functions of the system, as well as for I/O connectivity to devices outside of the computing system 1600. A networking interface 1610 can also be included for network connectivity. The network interface 1610 can control network communications both within the system and outside of the system. The network interface can include a wired interface, a wireless interface, a BLUETOOTH interface, optical interface, and the like, including appropriate combinations thereof. Furthermore, the computing system 1600 can additionally include a user interface 1612, a display screen 1614, as well as various other components that would be beneficial for such a system.

The processor(s) 1602 can be a single or multiple processors, and the memory 1604 can be a single or multiple memories. The local communication interface 1606 can be used as a pathway to facilitate communication between any of a single processor, multiple processors, a single memory, multiple memories, the various interfaces, and the like, in any useful combination.

The computing system 1600 can be powered by a battery, wireless charging, a renewal energy source (e.g., solar power or motion-based charging), or when connected to a charging port or wall outlet.

Various techniques, or certain aspects or portions thereof, can take the form of program code (i.e., instructions) embodied in tangible media, such as floppy diskettes, compact disc-read only memories (CD-ROMs), hard drives, a non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium is a computer readable storage medium that does not include a signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random access memory (RAM), erasable programmable read only memory (EPROM), flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example there is provided an apparatus comprising:
a memory; and
a storage controller operable to:
receive a search command with one or more parameters that instructs the storage controller to search for a data pattern in data stored in the memory; and
search the data stored in the memory for the data pattern according to the one or more parameters included in the search command, wherein the storage controller is configured to locally search the data stored in the memory for the data pattern without transferring the data to a processor to perform the search.

In one example of an apparatus, the one or more parameters in the search command include the data pattern to search for in the data stored in the memory, a data pattern length and a bitmask, wherein the bit mask indicates a portion of the data pattern to be searched for when searching the data stored in the memory for the data pattern.

In one example of an apparatus, the one or more parameters in the search command include:
a logical block addressing (LBA) range within the memory in which to search for the data pattern; and
a byte offset utilized when searching for the data pattern.

In one example of an apparatus, the one or more parameters in the search command include an alignment that defines a distance to shift when searching for the data pattern in the data stored in the memory, wherein the alignment is represented in bytes.

In one example of an apparatus, the one or more parameters in the search command include one or more flags that define potential outputs to provide after searching for the data pattern, wherein the potential outputs include location(s) of matches of the data pattern in the data stored in the memory and a number of matches of the data pattern.

In one example of an apparatus, the storage controller is further operable to:
identify a plurality of data chunks in the memory based on the one or more parameters included in the search command, wherein the one or more parameters include a logical block addressing (LBA) range parameter, a byte offset parameter and an alignment parameter, wherein each data chunk is sized in accordance with a data pattern length;
compare each of the data chunks to the data pattern to identify data chunks that match the data pattern, wherein the data chunks that match the data pattern are identified modulo a bit mask, and the bit mask is included in the one or more parameters in the search command; and
generate a vector of verdict bits corresponding to the plurality of data chunks, wherein a "1" indicates that a given data chunk matches the data pattern modulo the bit mask and a "0" indicates that a given data chunk does not match the data pattern.

In one example of an apparatus, the storage controller is further operable to: provide an output based on the vector of verdict bits, wherein the output includes at least one of: a number of data chunks in the memory that match the data pattern; a starting position for each of the data chunks in the memory that match the data pattern; a position of a next data chunk in the memory that matches the data pattern; or a number of logical block addressing (LBA) ranges in the memory containing data chunks that match the data pattern.

In one example of an apparatus, the storage controller is further operable to: identify the data pattern by searching in parallel data stored in multiple memory drives.

In one example of an apparatus, the memory comprises one or more of: dynamic random access memory (DRAM), synchronous dynamic random access memory (SDRAM), a hard disk drive (HDD), a solid-state drive (SSD), a redundant array of independent disks (RAID) volume, a non-volatile dual in-line memory module (NVDIMM), network attached storage, phase change memory (PCM) or non-volatile memory (NVM), wherein the NVM includes NAND memory and a three dimensional cross point (3D XPoint) memory.

In one example there is provided a host computer comprising:
  a processor;
  a memory; and
  a storage controller operable to:
    receive, from the processor, a search command with a first set of parameters that instructs the storage controller to search for a data pattern in data stored in the memory;
    search the data stored in the memory for the data pattern based on the first set of parameters included in the search command, wherein at least one instance of the data pattern is detected in the data stored in the memory;
    receive, from the processor, a replace command with a second set of parameters that instructs the storage controller to replace the at least one instance of the data pattern with a replacement pattern; and
    replace the at least one instance of the data pattern with the replacement pattern based on the second set of parameters included in the replace command.

In one example of a host computer, the storage controller is further operable to: perform the search command and the replace command locally in the memory without transferring the data in the memory to the processor.

In one example of a host computer, the first set of parameters in the search command include:
  a logical block addressing (LBA) range within the memory in which to search for the data pattern and a byte offset;
  the data pattern, a data pattern length and a bitmask, wherein the bit mask indicates a portion of the data pattern to be identified when searching the data stored in the memory for the data pattern; and
  an alignment that defines a distance to shift when searching for the data pattern in the data in the memory, wherein the alignment is represented in bytes.

In one example of a host computer, the second set of parameters in the replace command include:
  the replacement pattern; and
  a write mask that enables a portion of the data pattern to be replaced with a portion of the replacement pattern, wherein the write mask enables the data pattern to be blended with the replacement pattern.

In one example of a host computer, the storage controller is further operable to:
  identify a plurality of data chunks in the memory based on the one or more parameters included in the search command, wherein the one or more parameters include a logical block addressing (LBA) range parameter, a byte offset parameter and an alignment parameter, wherein each data chunk is sized in accordance with a data pattern length; and
  compare each of the data chunks to the data pattern to identify data chunks that match the data pattern, wherein the data chunks that match the data pattern are identified modulo a bit mask, and the bit mask is included in the one or more parameters in the search command.

In one example of a host computer, the storage controller is further operable to: apply the replacement pattern to each of the data chunks that match the data pattern, wherein the replacement pattern is merged with each of the data chunks in accordance with a write mask, wherein the storage controller does not perform actions with data chunks that do not match the data pattern.

In one example of a host computer, the storage controller is further operable to:
  delete data chunks in the memory that do not match the data pattern;
  eliminate one or more LBA ranges from the memory when the LBA ranges do not contain data chunks that match the data pattern;
  substitute data chunks in the memory that do not match the data pattern with a null pattern; or
  substitute one or more LBA ranges with a null pattern when the LBA ranges do not contain data chunks that match the data pattern.

In one example of a host computer, the host computer can further comprise one or more of: a display communicatively coupled to the processor; a network interface communicatively coupled to the processor; or a battery coupled to the processor.

In one example there is provided a method for performing search and replace operations in a memory, the method comprising:
  receiving, at a storage controller in a host computer, a replace command with a set of parameters that instructs the storage controller to search for a data pattern in data stored in a memory device of the host computer and replace at least one instance of the data pattern with a replacement pattern;
  searching, by the storage controller, the data stored in the memory device for the data pattern based on the set of parameters included in the replace command, wherein the storage controller is configured to locally search the data in the memory device for the data pattern without transferring the data to a processor of the host computer;
  detecting, at the storage controller, the at least one instance of the data pattern in the data stored in the memory; and
  replacing, at the storage controller, the at least one instance of the data pattern with the replacement pattern based on the set of parameters included in the replace command.

In one example of a method for performing search and replace operations in a memory, the method further comprises:
  receiving a replace command with a second set of parameters that instructs the storage controller to replace the at least one instance of the data pattern with a replacement pattern; and
  replacing the at least one instance of the data pattern with the replacement pattern based on the second set of parameters included in the replace command.

In one example of a method for performing search and replace operations in a memory, the method further comprises:

identifying a plurality of data chunks in the memory based on the set of parameters included in the replace command;

comparing each of the data chunks to the data pattern to identify data chunks that match the data pattern;

generating a vector of verdict bits corresponding to the plurality of data chunks, wherein a "1" indicates that a given data chunk matches the data pattern and a "0" indicates that a given data chunk does not much the data pattern; and providing an output based on the vector of verdict bits, wherein the output includes location(s) of matches of the data pattern in the data stored in the memory or a number of matches of the data pattern.

In one example of a method for performing search and replace operations in a memory, the method further comprises:

identifying a plurality of data chunks in the memory based on the set of parameters included in the replace command;

comparing each of the data chunks to the data pattern to identify data chunks that match the data pattern; and applying the replacement pattern to each of the data chunks that match the data pattern, wherein the replacement pattern is blended or merged with each of the data chunks in accordance with a write mask.

In one example of a method for performing search and replace operations in a memory, the set of parameters in the replace command include one or more of:

the data pattern to search for in the data stored in the memory, a data pattern length and a bitmask, wherein the bit mask indicates a portion of the data pattern to be identified when searching the data stored in the memory for the data pattern;

a logical block addressing (LBA) range within the memory in which to search for the data pattern;

a byte offset utilized when searching for the data pattern;

an alignment that defines a distance to shift when searching for the data pattern in the data stored in the memory, wherein the alignment is represented in bytes;

the replacement pattern; and a write mask that enables a portion of the data pattern to be replaced with a portion of the replacement pattern, wherein the write mask enables the data pattern to be blended with the replacement pattern.

In one example of a method for performing search and replace operations in a memory, the data pattern to be searched for and replaced is a defined expression that includes one or more of characters and numbers While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. An apparatus, comprising:
   a memory; and
   a storage controller operable to:
      receive a search command with one or more parameters that instructs the storage controller to search for a data pattern in data stored in the memory; and
      search the data stored in the memory for the data pattern according to the one or more parameters included in the search command, wherein the storage controller is configured to locally search the data in the memory for the data pattern without transfer of the data stored in the memory to a processor to perform the search, wherein to perform the search the storage controller is further configured to:
         identify a plurality of data chunks stored in the memory based on the one or more parameters included in the search command, wherein the one or more parameters include a logical block addressing (LBA) range parameter, a byte offset parameter, and an alignment parameter, wherein each data chunk is sized in accordance with a data pattern length; and
         compare each of the data chunks to the data pattern to detect data chunks that match the data pattern, wherein the data chunks that match the data pattern are identified modulo a bit mask, and the bit mask is included in the one or more parameters in the search command;
   in response to detecting at least one instance of data chunks of data stored in the memory that match the data pattern, the storage controller is further operable to;
      receive a replace command that instructs the storage controller to replace the detected data pattern with a replacement pattern; and
      replace the detected data pattern with the replacement pattern based on parameters included in the replace command, wherein the parameters included in the replace command include the replacement pattern and a write mask that enables a portion of the data pattern to be replaced with a portion of the replacement pattern, wherein the write mask enables the data pattern to be blended with the replacement pattern.

2. The apparatus of claim 1, wherein the one or more parameters in the search command include the data pattern to search for in the data stored in the memory, a data pattern length and a bit mask, wherein the bit mask indicates a portion of the data pattern to be searched for when searching the data stored in the memory for the data pattern.

3. The apparatus of claim 1, wherein the one or more parameters in the search command include:
   a logical block addressing (LBA) range within the memory in which to search for the data pattern; and
   a byte offset utilized when searching for the data pattern.

4. The apparatus of claim 1, wherein the alignment parameter defines a distance to shift when searching for the data pattern in the data stored in the memory, wherein the alignment is represented in bytes.

5. The apparatus of claim 1, wherein the one or more parameters in the search command include one or more flags that define potential outputs to provide after searching for the data pattern, wherein the potential outputs include location(s) of matches of the data pattern in the data stored in the memory and a number of matches of the data pattern.

6. The apparatus of claim 1, wherein the storage controller is further operable to:
   generate a vector of verdict bits corresponding to the plurality of data chunks, wherein a "1" indicates that a given data chunk matches the data pattern modulo the bit mask and a "0" indicates that a given data chunk does not match the data pattern.

7. The apparatus of claim 6, wherein the storage controller is further operable to: provide an output based on the vector of verdict bits, wherein the output includes at least one of: a number of data chunks in the memory that match the data pattern; a starting position for each of the data chunks in the memory that match the data pattern; a position of a next data chunk in the memory that matches the data pattern; or a number of logical block addressing (LBA) ranges in the memory containing data chunks that match the data pattern.

8. The apparatus of claim 1, wherein the storage controller is further operable to: identify the data pattern by searching in parallel data stored in multiple memory drives.

9. The apparatus of claim 1, wherein the memory comprises one or more of: dynamic random access memory (DRAM), synchronous dynamic random access memory (SDRAM), a hard disk drive (HDD), a solid-state drive (SSD), a redundant array of independent disks (RAID) volume, a non-volatile dual in-line memory module (NVDIMM), network attached storage, phase change memory (PCM) or non-volatile memory (NVM), wherein the NVM includes NAND memory and a three dimensional cross point (3D XPoint) memory.

10. A host computer, comprising:
a processor;
a memory; and
a storage controller operable to:
receive, from the processor, a search command with a first set of parameters that instructs the storage controller to search for a data pattern in data stored in the memory;
search the data stored in the memory for the data pattern based on the first set of parameters included in the search command, wherein the storage controller is configured to locally search the data stored in the memory for the data pattern without transfer of the data stored in the memory to the processor to perform the search, wherein to perform the search the storage controller is further configured to;
identify a plurality of data chunks stored in the memory based on the first set of parameters included in the search command, wherein the first set of parameters include a logical block addressing (LBA) range parameter, a byte offset parameter, and an alignment parameter, wherein each data chunk is sized in accordance with a data pattern length; and
compare each of the data chunks to the data pattern to detect data chunks that match the data pattern, wherein the data chunks that match the data pattern are identified modulo a bit mask, and the bit mask is included in the first set of parameters in the search command;
in response to detecting at least one instance of data chunks of data stored in the memory that match the data pattern, the storage controller is further operable to;
receive, from the processor, a replace command with a second set of parameters that instructs the storage controller to replace the matched data pattern with a replacement pattern; and
replace the matched data pattern with the replacement pattern based on the second set of parameters included in the replace command,
wherein the second set of parameters in the replace command includes:
the replacement pattern; and
a write mask that enables a portion of the data pattern to be replaced with a portion of the replacement pattern, wherein the write mask enables the data pattern to be blended with the replacement pattern.

11. The host computer of claim 10, wherein the first set of parameters in the search command includes:

a logical block addressing (LBA) range within the memory in which to search for the data pattern and a byte offset;
the data pattern, a data pattern length and a bitmask, wherein the bit mask indicates a portion of the data pattern to be identified when searching the data stored in the memory for the data pattern; and
an alignment that defines a distance to shift when searching for the data pattern in the data in the memory, wherein the alignment is represented in bytes.

12. The host computer of claim 10, wherein the storage controller is further operable to: apply the replacement pattern to each of the data chunks that match the data pattern, wherein the replacement pattern is merged with each of the data chunks in accordance with a write mask, wherein the storage controller does not perform actions with data chunks that do not match the data pattern.

13. The host computer of claim 10, wherein the storage controller is further operable to:
delete data chunks in the memory that do not match the data pattern;
eliminate one or more LBA ranges from the memory when the LBA ranges do not contain data chunks that match the data pattern;
substitute data chunks in the memory that do not match the data pattern with a null pattern; or
substitute one or more LBA ranges with a null pattern when the LBA ranges do not contain data chunks that match the data pattern.

14. The host computer of claim 10, further comprising one or more of:
a display communicatively coupled to the processor;
a network interface communicatively coupled to the processor; or
a battery coupled to the processor.

15. A method for performing search and replace operations in a memory, the method comprising:
receiving, at a storage controller in a host computer, a replace command with a first set of parameters that instructs the storage controller to search for a data pattern in data stored in a memory device of the host computer and replace at least one instance of the data pattern with a replacement pattern;
searching, by the storage controller, the data stored in the memory device for the data pattern based on the first set of parameters included in the replace command, wherein the storage controller is configured to locally search the data stored in the memory device for the data pattern without transferring the data stored in the memory device to a processor of the host computer, and wherein the searching further includes:
identifying a plurality of data chunks stored in the memory device based on the first set of parameters included in the search command, wherein the first set of parameters include a logical block addressing (LBA) range parameter, a byte offset parameter, and an alignment parameter, wherein each data chunk is sized in accordance with a data pattern length; and
compare each of the data chunks to the data pattern to detect data chunks that match the data pattern, wherein the data chunks that match the data pattern are identified modulo a bit mask, and the bit mask is included in the first set of parameters in the search command;
in response to detecting, at the storage controller, at least one instance of the data pattern in the data stored in the memory device that match the data pattern; and replacing, at the storage controller, the at least one instance of the data pattern with the replacement pattern based on a second set of parameters included in the replace command, wherein the second set of parameters included in the replace command includes: the replacement pattern and a write mask that enables a portion of the data pattern to be replaced with a portion of the replacement pattern, wherein the write mask enables the data pattern to be blended with the replacement pattern.

16. The method of claim 15, further comprising:

generating a vector of verdict bits corresponding to the plurality of data chunks, wherein a "1" indicates that a given data chunk matches the data pattern and a "0" indicates that a given data chunk does not much the data pattern; and providing an output based on the vector of verdict bits, wherein the output includes location(s) of matches of the data pattern in the data stored in the memory or a number of matches of the data pattern.

17. The method of claim 15, further comprising:

identifying a plurality of data chunks in the memory based on the set of parameters included in the replace command;

comparing each of the data chunks to the data pattern to identify data chunks that match the data pattern; and applying the replacement pattern to each of the data chunks that match the data pattern, wherein the replacement pattern is blended or merged with each of the data chunks in accordance with a write mask.

18. The method of claim 15, wherein the data pattern to be searched for and replaced is a defined expression that includes one or more of characters and numbers.

* * * * *